US 7,005,160 B2

(12) United States Patent
Todd et al.

(10) Patent No.: US 7,005,160 B2
(45) Date of Patent: Feb. 28, 2006

(54) METHODS FOR DEPOSITING POLYCRYSTALLINE FILMS WITH ENGINEERED GRAIN STRUCTURES

(75) Inventors: Michael A. Todd, Phoenix, AZ (US); Keith D. Weeks, Mesa, AZ (US)

(73) Assignee: ASM America, Inc., Phoenix, AZ (US)

( * ) Notice: Subject to any disclaimer, the term of this patent is extended or adjusted under 35 U.S.C. 154(b) by 115 days.

(21) Appl. No.: 10/424,207

(22) Filed: Apr. 24, 2003

(65) Prior Publication Data

US 2004/0213907 A1 Oct. 28, 2004

(51) Int. Cl.
*C23C 16/24* (2006.01)

(52) U.S. Cl. .............................. 427/255.28; 427/255.7; 427/376.1; 427/376.2; 438/488

(58) Field of Classification Search ................ 438/488; 427/255.28, 255.7, 376.1, 376.2
See application file for complete search history.

(56) References Cited

U.S. PATENT DOCUMENTS

| 4,631,804 | A |   | 12/1986 | Roy |
|---|---|---|---|---|
| 4,707,197 | A |   | 11/1987 | Hensel et al. |
| 4,966,861 | A |   | 10/1990 | Mieno et al. |
| 5,091,761 | A |   | 2/1992 | Hiraiwa et al. |
| 5,110,757 | A |   | 5/1992 | Arst et al. |
| 5,227,329 | A |   | 7/1993 | Kobayashi et al. |
| 5,231,056 | A |   | 7/1993 | Sandhu |
| 5,389,570 | A |   | 2/1995 | Shiozawa |
| 5,453,858 | A |   | 9/1995 | Yamazaki |
| 5,504,704 | A |   | 4/1996 | Sato et al. |
| 5,677,236 | A |   | 10/1997 | Saitoh et al. |
| 5,786,027 | A |   | 7/1998 | Rolfson |
| 5,959,326 | A |   | 9/1999 | Aiso et al. |
| 6,107,147 | A |   | 8/2000 | Kim et al. |
| 6,252,295 | B1 |   | 6/2001 | Cote et al. |
| 6,465,045 | B1 | * | 10/2002 | Heuer et al. ........... 427/255.393 |
| 6,610,361 | B1 | * | 8/2003 | Heuer et al. ........... 427/255.18 |
| 6,709,512 | B1 | * | 3/2004 | Yamoto et al. ............... 117/90 |
| 6,716,751 | B1 | * | 4/2004 | Todd ........................... 438/680 |

FOREIGN PATENT DOCUMENTS

| EP | 0 368 651 A2 | 5/1990 |
|---|---|---|
| JP | 63003463 A | 1/1988 |
| JP | 05062911 A | 3/1993 |
| JP | 07249618 A | 9/1995 |

OTHER PUBLICATIONS

Wolfe, D.M. et al.; Low–Temperature (450° C) Poly–Si Thin Film Deposition On $SiO_2$ and Glass Using A Microcrystalline–Si Seed Layer, Mat. Res. Soc. Symp. Proc., vol. 472, 1997, pp. 427–432.

Van Zant, Peter, "Microchip Fabrication: A Practical Guide to Semiconductor Processing," $4^{th}$ Edition, pp. 386–388 (2000).

* cited by examiner

Primary Examiner—Bret Chen
(74) Attorney, Agent, or Firm—Knobbe Martens Olson & Bear LLP (57) ABSTRACT

Methods for controlling the grain structure of a polycrystalline Si-containing film involve depositing the film in stages so that the morphology of a first film layer deposited in an initial stage favorably influences the morphology of a second film layer deposited in a later stage. In an illustrated embodiment, the initial stage includes an anneal step. In another embodiment, the later stage involves depositing the second layer under different deposition conditions than for the first layer.

41 Claims, 8 Drawing Sheets

METHODS FOR DEPOSITING POLYCRYSTALLINE FILMS WITH ENGINEERED GRAIN STRUCTURES

BACKGROUND OF THE INVENTION

1. Field of the Invention

This invention relates to methods for depositing polycrystalline Si-containing films and, more particularly, to methods for controlling the grain structure of such films.

2. Description of the Related Art

Polycrystalline silicon (also known as "polysilicon" or simply "poly") is widely used in the microelectronics fabrication industry and has been described as "the work horse material of advanced devices," see P. Van Zant, "Microchip Fabrication," 4$^{th}$ Ed., McGraw Hill, New York, pp. 386 (2000). For example, polysilicon is used in MOS gates, as load resistors in SRAM devices, trench fills, multilayer poly in EEPROMS, contact barrier layers, emitters in bipolar devices, memory cell capacitor electrodes, and as part of silicide metallization schemes. Typical polysilicon deposition processes take place by thermal chemical vapor deposition ("thermal CVD") in the 600° C. to 650° C. range, from either 100% silane or from gas streams containing silane and $N_2$ or $H_2$.

SUMMARY OF THE INVENTION

A preferred embodiment involves a method for depositing a polycrystalline Si-containing film, comprising:
- depositing a first Si-containing layer onto a substrate, the first Si-containing layer having a first morphology;
- annealing the first Si-containing layer for a period of time that is effective to alter the first morphology; and
- depositing a second Si-containing layer onto the first Si-containing layer, the second Si-containing layer having a polycrystalline morphology different from the first morphology.

Another preferred embodiment involves a method for depositing a polycrystalline Si-containing film, comprising:
- depositing a first polycrystalline Si-containing templating layer onto a substrate under first deposition conditions effective to provide the first polycrystalline Si-containing templating layer with a first degree of crystallization that is greater than 80%; and
- depositing a second polycrystalline Si-containing layer onto the first polycrystalline Si-containing templating layer under second deposition conditions different from the first deposition conditions, the second polycrystalline Si-containing layer having a second degree of crystallization that is at least equal to the first degree of crystallization,
- the first polycrystalline Si-containing templating layer and the second polycrystalline Si-containing layer together forming a Si-containing film, the Si-containing film having a polycrystalline morphology different from that of a comparable film deposited onto the substrate using the second deposition conditions without the first polycrystalline Si-containing templating layer.

These and other embodiments are described in greater detail below.

BRIEF DESCRIPTION OF THE DRAWINGS

These and other aspects of the invention will be readily apparent from the following description and from the appended drawings (not to scale), which are meant to illustrate and not to limit the invention, and wherein.

DETAILED DESCRIPTION OF THE PREFERRED EMBODIMENTS

Preferred embodiments involve the deposition of polycrystalline Si-containing films. Polycrystalline films have a morphology that is different from amorphous or single crystal films. Single crystal morphology is a crystalline structure that has a high degree of order. For example, epitaxial films are single crystal films characterized by a crystal structure and orientation that is an extension of the crystal structure of the substrate upon which they are grown. The atoms in single crystal films are arranged in a lattice-like structure that persists over relatively long distances (on an atomic scale). Amorphous morphology is a non-crystalline structure having a low degree of order because the atoms lack a definite periodic arrangement. Polycrystalline morphology is a crystalline structure that consists of a disorderly arrangement of orderly crystals and thus has an intermediate degree of order. The term "polycrystalline," as used herein, encompasses mixtures of amorphous and crystalline material, e.g., mixtures of amorphous and polycrystalline material. Such mixtures may be characterized as having a degree of crystallization that may be expressed as a percentage of crystalline material in the mixture on a volumetric basis. Those skilled in the art will appreciate from the foregoing that the term "polycrystalline" encompasses various polycrystalline morphologies that are not necessarily identical to one another. For example, polycrystalline morphologies may differ from one another in terms of the degree of crystallization, the size and distribution of polycrystals and/or grain boundaries, etc.

In general terms, preferred methods for depositing polycrystalline Si-containing films involve changing one or more deposition parameters during the deposition of the films in a manner that produces improved films, as compared to processes in which the deposition parameters are unchanged throughout the deposition process. In the following description of the preferred methods, several non-limiting illustrative embodiments are first described in which particular deposition parameters are described with specificity. Following the description of these illustrative embodiments, general deposition principles applicable to preferred embodiments are described.

Figure 1:
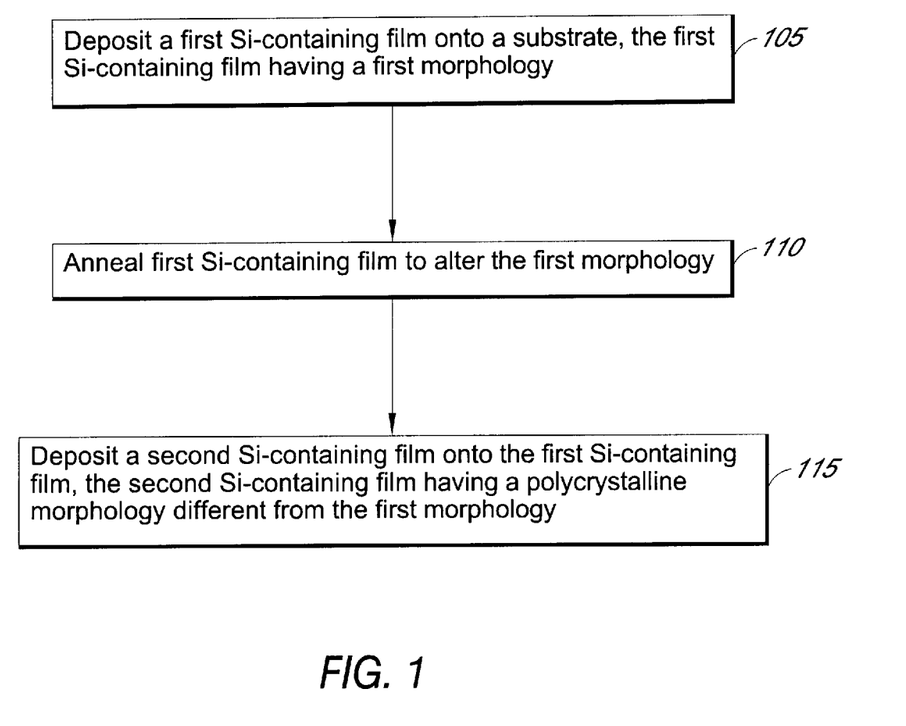
FIG. 1 shows a flow chart illustrating a preferred deposition process.

In a preferred embodiment, illustrated by the flow chart shown in FIG. 1, a first Si-containing layer having a first morphology is deposited onto a substrate during a first stage 105. The first morphology may be amorphous or polycrystalline, preferably polycrystalline. During a second stage 110, the first Si-containing layer is annealed under conditions that alter the morphology of the first layer, e.g., convert the amorphous morphology to polycrystalline or alter the polycrystalline morphology (e.g., increase grain size or increase degree of crystallization). During a third stage 115, a second Si-containing layer is deposited onto the first Si-containing layer, the second Si-containing layer having a polycrystalline morphology different from the first morphology. The morphology of the second Si-containing layer is preferably influenced by the altered morphology of the underlying first layer created during the second stage 110. For the purposes of illustration, the stages 105, 110, 115 in FIG. 1 are shown as separate steps, but it will be understood by those skilled in the art that the steps may overlap to some extent, e.g., the annealing stage 110 may be commenced during the first stage 105.

Figure 2:
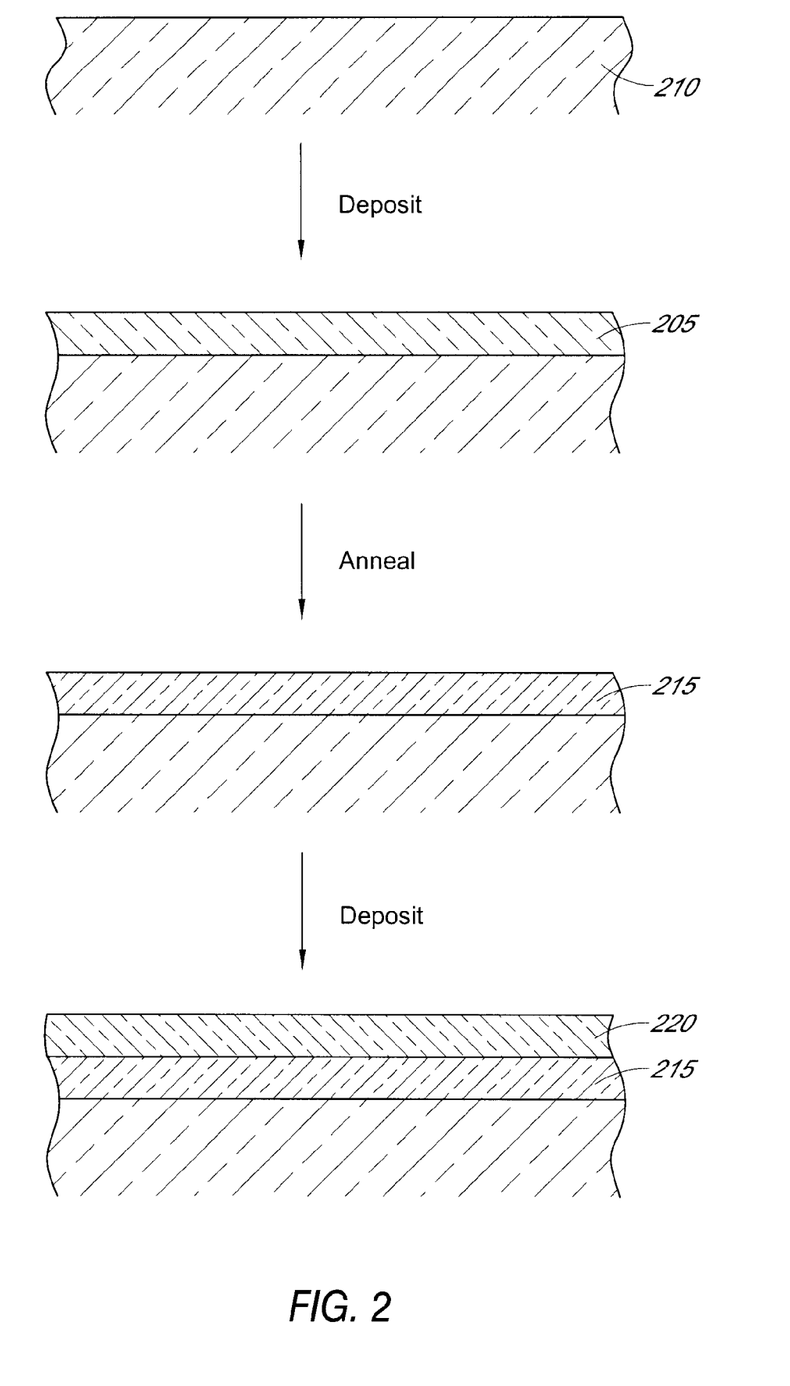
FIG. 2 shows a series of cross section schematic drawings illustrating a preferred method for depositing a polysilicon film.

In a preferred embodiment, a polysilicon film is deposited onto a substrate according to the process shown in FIG. 1, as illustrated in the series of cross sectional schematic diagrams shown in FIG. 2. FIG. 2 portrays a first polysilicon layer 205 deposited onto a substrate 210 during the first stage 105. The substrate 210 may be virtually any material having a surface suitable to receive the deposition. Non-limiting, non-mutually exclusive examples of suitable substrates include insulators, conductors, semiconductors, polycrystalline materials, non-polycrystalline materials, single crystal materials, non-single crystal materials, and amorphous materials. Preferred substrates include those comprising a material selected from the group consisting of polysilicon, $SiO_2$, $Si_3N_4$, metal oxide (e.g., $RuO_2$, $HfO_2$, $ZrO_2$, etc.), metal silicate (e.g., $RuSiO_x$, $HfSiO_x$, $ZrSiO_x$, etc.), metal oxynitrides (e.g., $RuO_xN_y$, $HfO_xN_y$, $ZrO_xN_y$, etc.), metal silicates doped with nitrogen (e.g., $RuSiO_x N_y$, $HfSiO_xN_y$, $ZrSiO_xN_y$, etc.), metal (e.g., Pt, Ru, Ir, Cu, W, Ta, etc.) and single crystal silicon.

In the illustrated embodiment, the substrate 210 is $SiO_2$ and the first polysilicon layer 205 has a polycrystalline morphology that is preferably controlled in a chemical vapor deposition (CVD) process by controlling the deposition conditions, e.g., feed gas composition, deposition temperature, pressure, feed gas flow rate, and/or deposition time as described below. These process parameters are preferably varied in a systematic fashion in order to identify the desired deposition conditions for each particular layer. Preferably, experimental design methods are used to determine the effect of the various process variables and combinations thereof on layer morphology. Experimental design methods per se are well-known, see e.g., Douglas C. Montgomery, "Design and Analysis of Experiments," $2^{nd}$ Ed., John Wiley and Sons, 1984. For a particular process, after the effect of the various process variables and combinations thereof on morphology and crystalline properties have been determined by these experimental design methods, the process is preferably automated by computer control to ensure batch-to batch or wafer-to-wafer consistency.

The feed gas used to deposit the first polysilicon layer 205 comprises a silicon source, preferably a silicon source selected from the group consisting of silane, disilane, and trisilane, at a partial pressure that is preferably in the range of about $1\times10^{-6}$% to about 100% of the total pressure, more preferably about $1\times10^{-4}$% to about 100%, same basis. The feed gas may also comprise a carrier gas, preferably hydrogen, helium, argon, neon, nitrogen, or mixtures thereof. The carrier gas flow rate is typically in the range of about 5 standard liters per minute (slm) to about 60 slm. The feed gas flow rate is typically in the range of about 1 standard cubic centimeter per minute (sccm) to about 1,000 sccm for a preferred deposition chamber such as an Epsilon™ single-wafer, horizontal gas flow reactor, commercially available from ASM America, Inc. of Phoenix, Ariz. The total pressure in the CVD chamber during deposition is preferably in the range of about 1 Torr to about 800 Torr, more preferably in the range of about 2 Torr to about 200 Torr, most preferably in the range of about 5 Torr to about 60 Torr. Preferably, the deposition temperature is about 600° C. or greater, more preferably in the range of about 600° C. to about 750° C. In an alternative embodiment (not shown in FIG. 2), the first silicon layer is amorphous, and is deposited at a temperature in the range of up to about 600° C., preferably in the range of about 350° C. to about 600° C., more preferably about 400° C. to about 550° C. The deposition temperature for a particular process depends to some extent on the feed gas composition. For example, deposition processes utilizing less thermally stable silicon sources such as trisilane may be conducted at lower deposition temperatures than when more thermally stable silicon sources such as silane are used. Deposition is continued for a period of time that is effective to deposit the first polysilicon layer 205 to the desired thickness. The deposition time to achieve a particular thickness depends on the other deposition parameters. For example, higher deposition rates (and thus shorter deposition times to achieve a target layer thickness) may be achieved by using higher deposition temperatures, higher feed gas flow rates, and/or a feed gas that contains a higher proportion of a less thermally stable silicon source (e.g., trisilane) and a lower proportion of a more thermally stable silicon source (e.g., silane).

FIG. 2 further portrays the polysilicon layer 215 obtained by annealing the first polysilicon layer 205 during the second stage 110. The annealing temperature may be the same as, or different from, the deposition temperature during the first stage 105, and is preferably about 600° C. or greater, more preferably in the range of about 600° C. to about 700° C. Annealing is continued for a period of time that is effective to alter the morphology of the first polysilicon layer 205, thereby producing an annealed polysilicon layer 215. In the alternative embodiment described above in which the first silicon layer is amorphous, annealing is preferably continued for a period of time that is effective to convert the amorphous silicon layer into the polysilicon layer 215. Suitable annealing times vary depending on the degree of morphology alteration desired, the thickness of the layer and the annealing temperature, and are typically in the range of about 10 seconds to about ten minutes, more preferably about 20 seconds to about five minutes. Shorter annealing times may be used at higher annealing temperatures and when smaller degrees of morphology alteration are desired. Using these guidelines, routine experimentation may be used to select an annealing time and/or temperature for a particular deposition process, often in the context of other process considerations such as thermal budget and production rate. The degree of alteration of the morphology of the first polysilicon layer 205 may be determined by, e.g., X-ray diffraction (XRD), optical microscopy, scanning electron microscopy (SEM), transmission electron microscopy (TEM) (plan view or cross-sectional), and/or atomic force microscopy (AFM).

FIG. 2 further portrays a second polysilicon layer 220 deposited onto the annealed polysilicon layer 215 during the third stage 115. The deposition of the second polysilicon layer 220 may be conducted in the same general manner as described above for the deposition of the first polysilicon layer 205. During any particular deposition process, the various deposition parameters (e.g., deposition temperature, pressure, feed gas composition, feed gas flow rate and deposition time) used to deposit the first polysilicon layer 205 during the first stage may each be the same as, or may each be different from, the corresponding deposition parameters used to deposit the second polysilicon layer 215 during the third stage. For example, the feed gas composition and feed gas flow rate during the third stage 115 may be the same as, or different from, the feed gas composition and feed gas flow rate during the first deposition stage 105. In a preferred embodiment, the feed gas used for the first stage 105 is different from the feed gas used for the third stage 115. In another preferred embodiment, the feed gas flow rate during the third stage 115 is different from, and preferably higher than, the feed gas flow rate during the first stage 105, the feed gas being the same for both stages 105, 115 for that embodiment. Similarly, the temperature and pressure during each of the three stages 105, 110, 115 may be the same as, or different than, the corresponding temperatures and pressures during each of the other two stages. In a preferred embodiment, the temperature is varied between the first, second and third stages 105, 110, 115.

This invention is not bound by theory, but it is believed that the morphology of the second Si-containing layer (e.g., the second polysilicon layer 220) is strongly influenced or controlled by the morphology created in the second stage 110 by annealing the first Si-containing layer (e.g., the first polysilicon layer 205). The morphology of the second Si-containing layer may be engineered in a controlled manner by controlling the deposition and annealing conditions of the first Si-containing layer during the first stage 105 and the second stage 110. Examples 1–12 below demonstrate that the resulting polycrystalline Si-containing film (a single functional layer containing the first and second layers) may be obtained at a lower deposition temperature by using an annealing stage as described herein, as compared to an otherwise equivalent deposition conducted without such an annealing stage.

Figure 3:
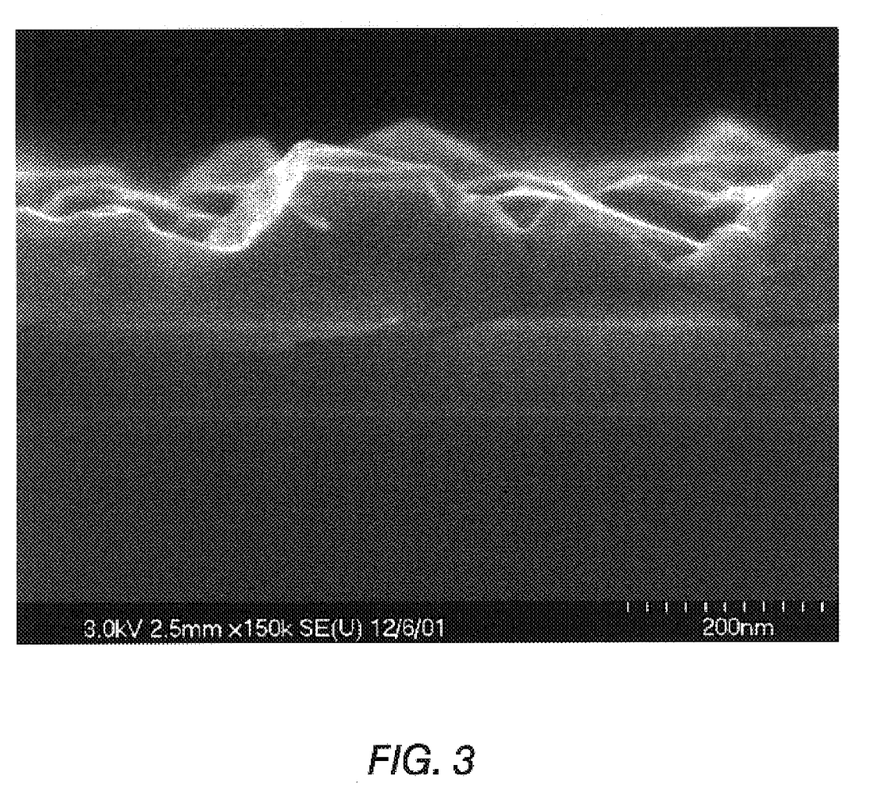
FIG. 3 shows a photomicrograph of a film deposited using silane at the same magnification as the photomicrograph shown in FIG. 4.
Figure 4:
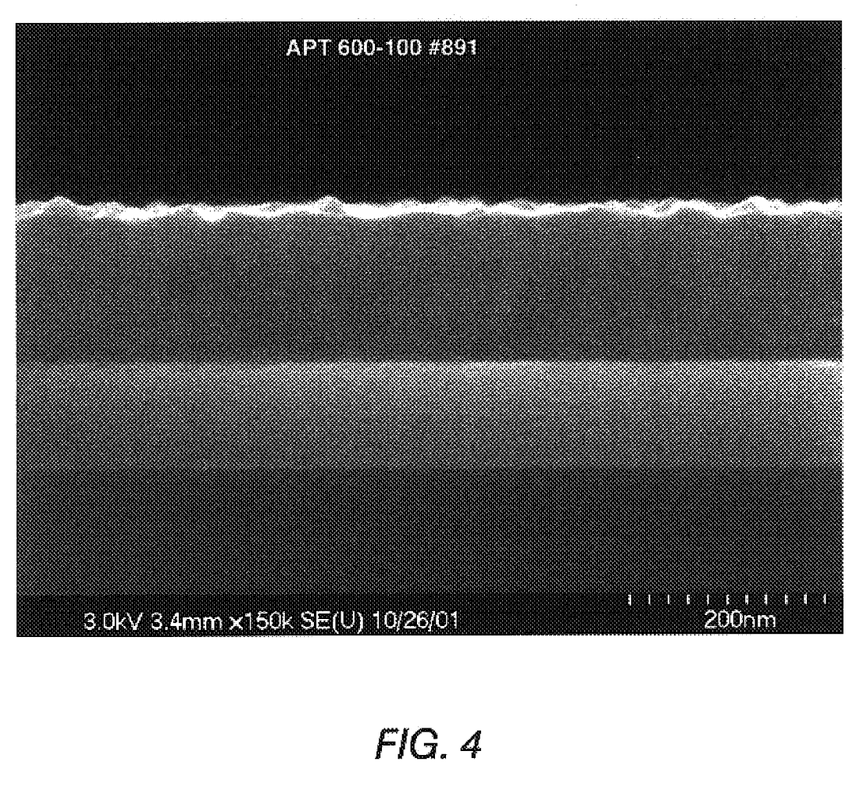
FIG. 4 shows a photomicrograph of a film deposited using trisilane under the same conditions as the film shown in FIG. 3.

It has been found that the annealing of the first Si-containing layer is affected by its thickness. As compared to thicker layers, thinner Si-containing layers typically can be annealed more quickly to produce higher quality polycrystalline layers. Preferably, the first Si-containing layer has a thickness of about 500 Å or less, more preferably about 200 Å or less, even more preferably about 100 Å or less. Film thickness may be controlled by controlling the deposition time. Trisilane is a particularly preferred silicon source for the deposition of thin Si-containing layers because the resulting layers tend to have a more uniform thickness, thus providing a more uniform base upon which to deposit the second Si-containing layer, particularly for the thin films of the preferred embodiment. For example, FIG. 3 shows a scanning electron microscopy (SEM) photomicrograph of a cross-sectioned polycrystalline SiGe film deposited at 600° C. using silane as a silicon source and germane as a germanium source. The surface roughness of the SiGe film shown in FIG. 3 (as measured by atomic force microscopy) was 226 Å rms for a 10 micron×10 micron scan area. FIG. 4 shows an SEM photomicrograph of a cross-sectioned polycrystalline SiGe film deposited under equivalent conditions except using trisilane as a silicon source. The surface roughness of the SiGe film shown in FIG. 4 (as measured by atomic force microscopy) was 18.4 Å rms for a 10 micron×10 micron scan area, demonstrating that the film deposited using trisilane had much better thickness uniformity. The use of trisilane also allows for faster depositions at lower deposition temperatures than traditional silicon sources such as silane. Trisilane may be used for the production of the first Si-containing layer and/or the second Si-containing layer, preferably both.

The preferred embodiment illustrated by the flow chart shown in FIG. 1 may be used to deposit polycrystalline films over a broad range of film thicknesses, e.g., from about 50 Å to about 10,000 Å, but is particularly useful for depositing polycrystalline films having a thickness of about 600 Å or greater. High quality polycrystalline Si-containing films may be deposited by direct deposition of the polycrystalline film under a particular set of fixed deposition conditions (deposition conditions not varied over the course of the deposition) or by depositing an amorphous film, then annealing. However, for the deposition of thicker films, e.g., polycrystalline Si-containing films having a thickness of about 600 Å or greater, it is often difficult to produce films having the desired morphological and crystalline properties by direct deposition using fixed deposition conditions or by annealing a relatively thick amorphous Si-containing film. Heretofore, the production of thick polycrystalline films by annealing a thick amorphous Si-containing film was not favored because it was difficult to achieve the desired crystalline properties, e.g., high degree of random grain orientation, small grain size, uniform grain size, and uniform grain size distribution. Likewise, direct deposition under fixed deposition conditions generally involved an unsatisfactory trade-off between the achievement of, e.g., a particular crystalline property and another, between the use of a desirable process parameter (such as fast deposition) and the achievement of a desirable crystalline property (such as small grain size), and/or between the use of a desirable process parameter (such a fast deposition) and another desirable process parameter (such as low deposition temperature).

The preferred embodiment illustrated by the flow chart shown in FIG. 1 provides a solution to this problem. An annealed polycrystalline Si-containing layer is formed during the first and second stages 105, 110. Preferably, the annealed polycrystalline Si-containing layer has a thickness that is less than the thickness of the second Si-containing layer. For example, the annealed polycrystalline Si-containing layer preferably has a thickness of about 500 Å or less, more preferably about 200 Å or less, even more preferably about 100 Å or less. The annealed polycrystalline Si-containing layer preferably functions as a crystallographic and morphological template for the subsequent deposition of the second polycrystalline Si-containing layer during the third stage 115. The second polycrystalline Si-containing layer may be deposited at a relatively high deposition rate during the third stage 115, in order to speed production and to make up for any deposition time lost during the annealing stage 110. The crystallographic and morphological properties of the second polycrystalline layer can be tuned, even when deposited in a thickness of 500 Å or greater at a relatively high deposition rate, because of the favorable influence of the underlying first polycrystalline Si-containing layer. In preferred embodiments, the thickness of the resulting polycrystalline Si-containing film (a single functional layer containing the first and second layers) is about 600 Å or greater, more preferably about 1,000 Å or greater. The first Si-containing layer is preferably relatively thin, allowing for a greater degree of control and variability over its final crystallographic and morphological properties as a function of annealing conditions. The properties of the first Si-containing layer may enable the second Si-containing layer to also be deposited relatively quickly while maintaining the desired crystallographic and morphological properties, despite its thickness.

Those skilled in the art understand that it is difficult to alter the degree of film crystallization and the resulting morphology at a given temperature using fixed deposition conditions. However, it has now been discovered that the degree of crystallization and the morphology of the film can be controlled by the practice of preferred embodiments such as are illustrated by the flow chart shown in FIG. 5. In the illustrated embodiment, a first polycrystalline Si-containing templating layer is deposited onto a substrate during a first stage 505. The first polycrystalline Si-containing layer is deposited under conditions that are effective to produce a first degree of crystallization in the first polycrystalline Si-containing layer that is greater than 80%, more preferably greater than about 85%. A higher degree of crystallinity can be achieved by using lower deposition rates at a given temperature. Preferably, the first polycrystalline Si-containing layer is relatively thin so that the total time to carry out the first stage is relatively short, despite the relatively slow deposition rate. The thickness of the first Si-containing layer is preferably in the range of from about 10 Å to about 500 Å, more preferably about 20 Å to about 200 Å, most preferably about 25 Å to about 100 Å. The feed gas preferably contains trisilane, particularly for the deposition of thin layers, to obtain the benefits of improved uniformity as illustrated in FIGS. 3–4 and discussed above. The deposition rate for the first Si-containing templating layer typically depends strongly on the silicon source and the deposition temperature. For example, at a given deposition temperature, higher deposition rates may be achieved using trisilane than silane. Likewise, for a given silicon source, deposition rates are generally higher at higher temperatures. The deposition rate is preferably in the range of about one Å per minute to about 2,000 Å per minute, more preferably about 5 Å per minute to about 500 Å per minute.

Figure 5:
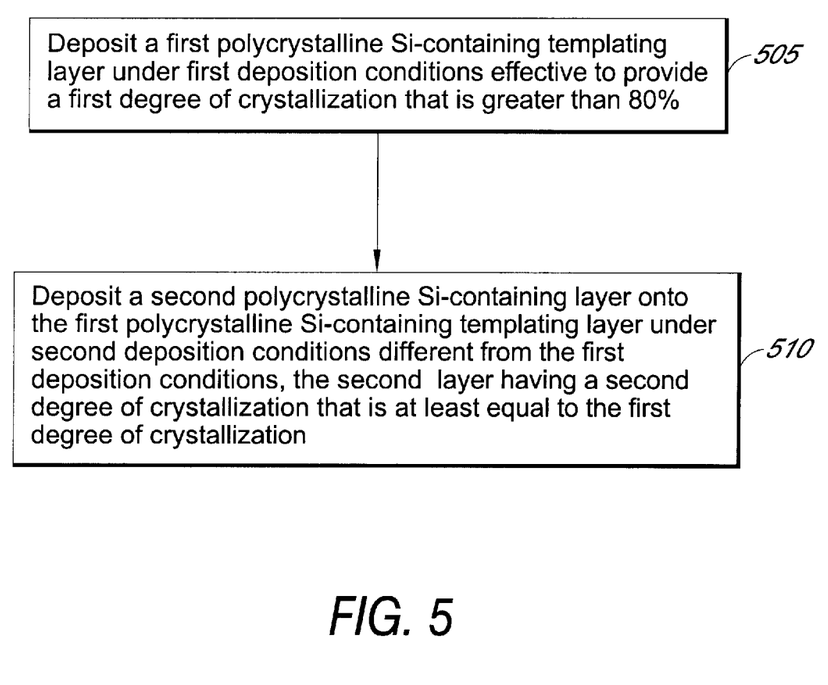
FIG. 5 shows a flow chart illustrating a preferred deposition process.

A second polycrystalline Si-containing layer is then deposited onto the first polycrystalline Si-containing templating layer during a second stage 510, under second deposition condition different from the first deposition conditions used during the first stage 505. The deposition rate during the second stage may be greater than the deposition rate during the first stage. Although such a faster rate would be expected to reduce the degree of crystallinity in the second layer, it has been found that the second polycrystalline Si-containing layer has a second degree of crystallization that is at least equal to the first degree of crystallization when the same deposition temperature is used for both layers. This invention is not bound by theory, but it is believed that the morphology and the crystalline properties of the second polycrystalline Si-containing layer deposited during the second stage 510 are strongly influenced or controlled by the morphology and crystalline properties of the first polycrystalline Si-containing templating layer. In accordance with a preferred embodiment, the morphology and crystallographic properties of the second Si-containing layer may be engineered in a controlled manner by controlling the deposition conditions (e.g., deposition rate) of the first Si-containing templating layer during the first stage 505.

In preferred embodiments, the first templating layer deposited during the first stage 505 and the second layer deposited during the second stage 510 together form a single functional film that has a polycrystalline morphology that is different from a comparable film deposited using the deposition conditions employed during the second stage 510, but not deposited onto a templating layer. A "comparable film" is a film deposited under a fixed set of deposition conditions that has about the same thickness as the film to which it is being compared (e.g., the single film deposited during the two stage 505, 510), but which is not deposited onto a templating layer. Preferably, the second polycrystalline Si-containing layer is relatively thick, so that a faster deposition rate may be used during the second stage 510 to deposit the second layer, more than compensating for the slower deposition rate used to deposit the thinner first layer. Thus, the resulting film (the single functional film containing the first and second layers) is preferably different from a comparable film deposited under the second deposition conditions but in the absence of the templating layer, and/or deposited more quickly than a comparable film having comparable crystallographic and morphological properties but deposited under fixed deposition conditions (if such a film can even be deposited using a single step process). The deposition rate for the second Si-containing layer is preferably about 25 Å per minute or greater, more preferably about 50 Å per minute or greater, even more preferably about 100 Å per minute or greater. The second layer is preferably deposited at a rate that is at least about 10% faster than the first layer, more preferably at least about 25% faster, even more preferably at least about 50% faster. Despite the faster deposition rate, the second polycrystalline Si-containing layer has a degree of crystallization that is preferably greater than 80%, more preferably about 85% or greater, most preferably about 90% or greater. The thickness of the second Si-containing layer is preferably about 500 Å or greater, more preferably about 1,000 Å or greater, most preferably about 1,500 Å or greater.

Figure 6:
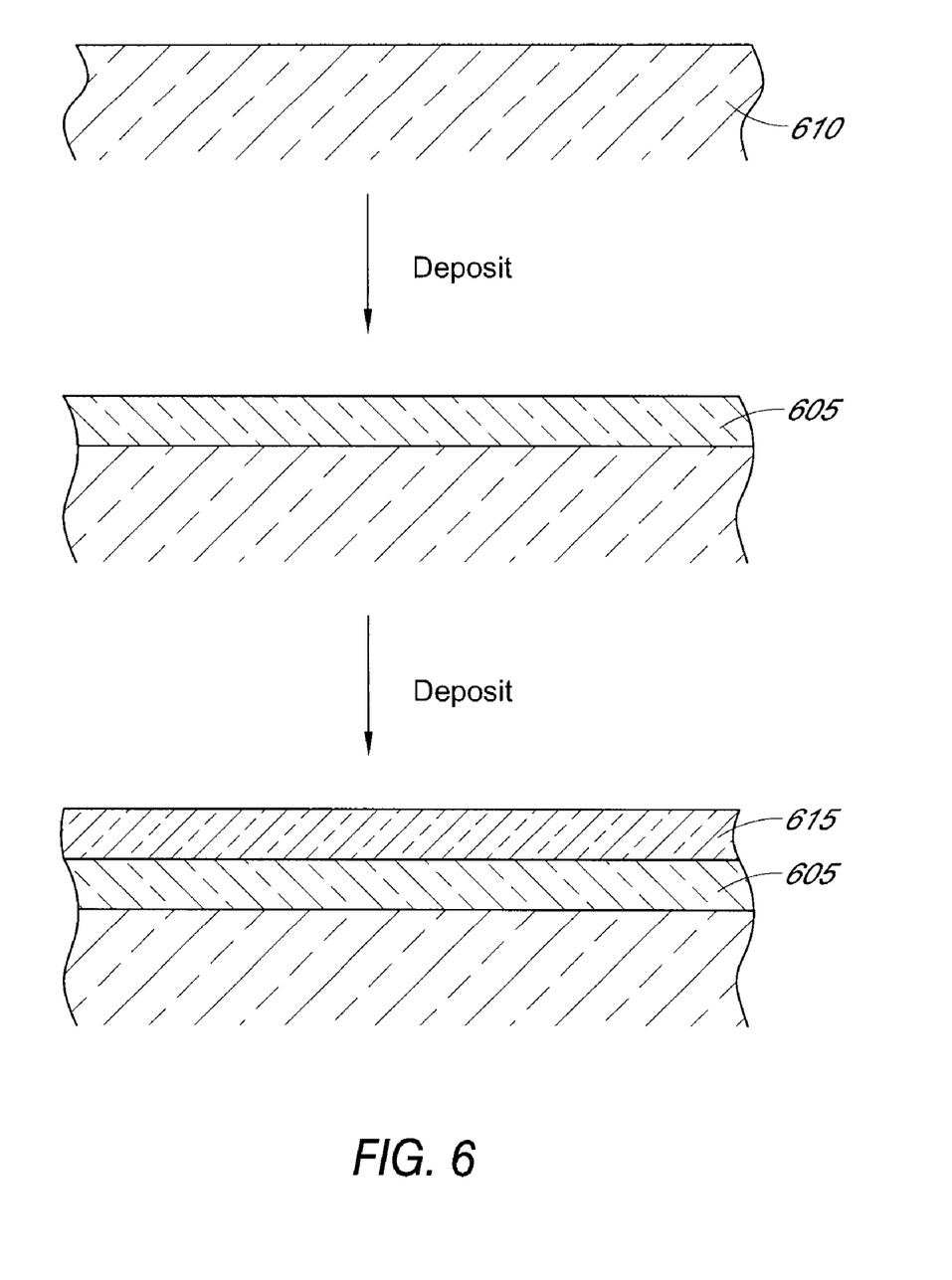
FIG. 6 shows a series of cross section schematic drawings illustrating a preferred method for depositing a polysilicon film.

In a preferred embodiment, a polysilicon film is deposited onto a substrate according to the process shown in FIG. 5, as illustrated in the series of cross sectional schematic diagrams shown in FIG. 6. FIG. 6 portrays a first polysilicon layer 605 deposited onto a substrate 610 during the first stage 505. In the illustrated embodiment, the first polysilicon layer 605 has a polycrystalline morphology that results from a relatively low deposition rate. The deposition rate is preferably controlled in a CVD process by the deposition temperature, pressure, feed gas composition and/or feed gas flow rate. Preferably, the deposition temperature is about 600° C. or greater, more preferably in the range of about 600° C. to about 750° C., depending on the silicon source (see above). Lower rates of deposition are typically achieved at lower temperatures when the other deposition parameters are held constant. The total pressure in the CVD chamber during deposition is preferably in the range of about 1 Torr to about 800 Torr, more preferably in the range of about 2 Torr to about 200 Torr, most preferably in the range of about 5 Torr to about 60 Torr. Lower rates of deposition are typically achieved at lower deposition pressures when the other deposition parameters are held constant.

The feed gas used to deposit the first polysilicon layer 605 comprises a silicon source, preferably a silicon source selected from the group consisting of silane, disilane, and trisilane, at a partial pressure that is preferably in the range of about $1 \times 10^{-6}$% to about 100% of the total pressure, more preferably about $1 \times 10^{-4}$% to about 100%, same basis. The feed gas may also comprise a carrier gas, preferably hydrogen, helium, argon, neon, nitrogen, or mixtures thereof. Lower rates of deposition are typically achieved at lower partial pressures for the silicon source when the other deposition parameters are held constant. In a preferred embodiment, the deposition rate of the first polysilicon layer 605 is primarily controlled by controlling the feed gas flow rate for a given set of deposition parameters. For example, for a preferred deposition chamber such as an Epsilon™ single-wafer, horizontal gas flow reactor, commercially available from ASM America, Inc. of Phoenix, Ariz., the feed gas flow rate during deposition is typically in the range of about 1 sccm to about 1,000 sccm. Using the aforementioned guidelines, routine experimentation may be used to select the deposition parameters for a particular deposition process conducted in a particular reactor, often in the context of other process considerations such as thermal budget and production rate.

FIG. 6 further portrays a second polysilicon layer 615 deposited onto the first polysilicon layer 605 during the second stage 510. The deposition of the second polysilicon layer 615 may be conducted in the same general manner as described above for the deposition of the first polysilicon layer 605, except that one or more deposition parameters are manipulated to deposit the layer 615 with a degree of crystallization that is at least equal to the degree of crystallization of the first templating layer 605, and, preferably, at an increased deposition rate. In the illustrated embodiment, the resulting film (containing the first and second layers 605, 615) has a polycrystalline morphology that is different from a comparable film. The comparable film is not deposited onto a templating layer, but otherwise is deposited under the same deposition conditions as used to deposit the second layer 615, except that the deposition time is controlled so that the comparable film has a thickness about equal to the combined thickness of the first and second layers 605, 615. One or more deposition parameters, e.g., deposition temperature, pressure, feed gas composition and/or feed gas flow rate, are preferably manipulated in accordance with the guidelines provided above to increase the deposition rate of the second polysilicon layer 615 as compared to the first polysilicon layer 605.

More preferably, the deposition rate is primarily controlled by controlling the feed gas flow rate during the deposition of first polysilicon templating layer 605 and second polysilicon layer 615. In a preferred embodiment, the deposition temperature, pressure, and feed gas composition are kept relatively constant throughout the deposition of both layers, but the temperature, pressure and feed gas composition can also be varied for each of the layers. For a particular deposition temperature, pressure, and feed gas composition, the feed gas flow rate during the first stage 505 is preferably selected to result in a relatively low deposition rate that is effective to produce a first degree of crystallization in the first polysilicon templating layer 605 that is greater than 80%, more preferably greater than about 85%. The feed gas flow rate for a particular process typically depends on the size and/or configuration of the reactor. For example, for a preferred deposition chamber such as an Epsilon™ single-wafer, horizontal gas flow reactor, the feed gas flow rate during deposition of the first polysilicon templating layer 605 is preferably in the range of about 1 sccm to about 1,000 sccm, more preferably about 1 sccm to about 500 sccm. In this embodiment, the feed gas flow rate is then increased to deposit the second polysilicon layer 615. Despite the resulting increase in deposition rate, the degree of crystallization obtained in the resulting second polysilicon layer 615 is equal to or greater than that of the first polysilicon templating layer 605, preferably greater than 80%, more preferably greater than about 85%. For a preferred deposition chamber such as an Epsilon™ single-wafer, horizontal gas flow reactor, the feed gas flow rate during deposition of the second polysilicon layer 615 is preferably in the range of about 25 sccm to about 1,000 sccm. The change in flow rate from the first stage 505 to the second stage 510 may be conducted in a step or series of steps, or may be ramped to change continuously in a linear or non-linear fashion.

In an alternate embodiment, the deposition rate is primarily controlled by controlling the temperature and pressure during the deposition of first polysilicon layer 605 and second polysilicon layer 615. In a preferred aspect of this embodiment, the feed gas composition (and, optionally, the flow rate) is kept relatively constant throughout the deposition of both layers. For a particular feed gas composition, the temperature and pressure during the first stage 505 are preferably selected to result in a relatively low deposition rate that is effective to produce a first degree of crystallization in the first polysilicon templating layer 605 that is greater than 80%, more preferably greater than about 85%. For example, the mathematical product of pressure and temperature during the deposition of the first polysilicon templating layer 605 is preferably in the range of about 5,000 Torr·° C. to about 30,000 Torr·° C., more preferably about 7,000 Torr·° C. to about 10,000 Torr·° C. The temperature and/or pressure are then increased in this embodiment to deposit the second polysilicon layer 615. During the deposition of the second polysilicon layer 615, the mathematical product of pressure and temperature is preferably at least about 4,500 Torr·° C., more preferably at least about 5,500 Torr·° C., even more preferably at least about 7,500 Torr·° C. Despite the resulting increase in deposition rate, the degree of crystallization obtained in the resulting second polysilicon layer 615 is equal to or greater than that of the first polysilicon templating layer 605, preferably greater than 80%, more preferably greater than about 85%. The change in pressure and/or temperature from the first stage 505 to the second stage 510 may be conducted in a step or series of steps, or may be ramped to change continuously in a linear or non-linear fashion.

Other preferred embodiments involve variants of the embodiments illustrated in FIGS. 1 and 5 in which the feed gas composition is varied over the course of the deposition. For example, the feed gas composition in one stage, e.g., the first stage 105, 505, may be different from the feed gas composition in a different stage, e.g., the third stage 115 or the second stage 510, respectively. The feed gas composition may also be varied within a particular stage. The feed gas composition may be varied in a stepwise or continuous fashion, and is preferably used to accomplish specific goals, e.g., to achieve a desired thickness or deposition rate for a film having the desired crystallographic and morphological properties. For example, in a preferred embodiment, the first Si-containing templating layer is deposited using a first feed gas that comprises trisilane. The use of trisilane to deposit thin films enables greater layer uniformity and higher deposition rates at temperatures below 650° C., as compared to silane. More preferably, at least about 50%, even more preferably at least about 75%, of the silicon source in the first feed gas is trisilane, by weight based on total silicon source weight. The second Si-containing layer is then deposited onto the first Si-containing layer using a second feed gas different from the first feed gas. In a preferred embodiment, the second feed gas comprises trisilane in an amount that is different from the amount in the first feed gas. The second feed gas may comprise a mixture of trisilane and silane, or may be substantially free of trisilane.

The illustrated embodiments described above are non-limiting and will enable those skilled in the art to practice numerous variants. Deposition principles applicable to preferred embodiments and variants thereof are described below.

Deposition of Si-containing films may be suitably conducted according to the various chemical vapor deposition (CVD) methods known to those skilled in the art, but the greatest benefits are obtained when deposition is conducted according to the improved CVD process techniques taught herein. The disclosed processes may be suitably practiced by employing CVD, including plasma-enhanced chemical vapor deposition (PECVD) or thermal CVD, utilizing a feed gas comprising a silicon source to deposit a Si-containing film onto a substrate contained within the CVD chamber. Deposition may take place onto virtually any amorphous or crystalline substrate. Preferred substrates include those comprising a material selected from the group consisting of polysilicon, $SiO_2$, $Si_3N_4$, metal oxide (e.g., $RuO_2$, $HfO_2$, $ZrO_2$, etc.), metal silicate (e.g., $RuSiO_x$, $HfSiO_x$, $ZrSiO_x$, etc.), metal oxynitrides (e.g., $RuO_xN_y$, $HfO_xN_y$, $ZrO_xN_y$, etc.), metal silicates doped with nitrogen (e.g., $RuSiO_xN_y$, $HfSiO_xN_y$, $ZrSiO_xN_y$, etc.), metal (e.g., Pt, Ru, Ir, Cu, W, Ta, etc.) and single crystal silicon. A suitable manifold may be used to supply feed gas(es) to the CVD chamber. The feed gas can also include carrier gases, preferably hydrogen, helium, argon, neon, or nitrogen. Preferably, trisilane is introduced to the chamber by way of a bubbler used with a carrier gas to entrain trisilane vapor, more preferably a temperature controlled bubbler. Preferably, the gas flow in the CVD chamber is horizontal, most preferably the chamber is a single-wafer, horizontal gas flow reactor, preferably radiatively heated. Suitable reactors of this type are commercially available, and preferred models include the Epsilon™ series of single wafer epitaxial reactors commercially available from ASM America, Inc. of Phoenix, Ariz. While the processes described herein can also be employed in alternative reactors, such as a showerhead arrangement, benefits in increased uniformity and deposition rates have been found particularly effective in the horizontal, single-pass, laminar gas flow arrangement of the Epsilon™ chambers.

Those skilled in the art will understand that various polycrystalline Si-containing films may be produced by the methods generally illustrated in FIGS. 1 and 5, including polysilicon, SiGe, SiGeC, SiN, SiON, and doped versions thereof, by selection of the composition of the feed gas. In this context, those skilled in the art will understand that terms such as "SiGe," "SiGeC," "SiN," and "SiON" are terms of art used to show that the film comprises the indicated elements, and are not to be construed as limiting the relative proportions of those elements nor as excluding the presence of other elements. Thus, for example, a "SiGe" film may contain Si and Ge in various proportions and may contain other elements as well, e.g., electrically active dopants such as antimony, boron, arsenic and phosphorous.

The composition of the feed gas may be adjusted to produce a Si-containing film containing the desired element or elements. Doped polysilicon, Si-containing alloys, e.g., SiGe, SiGeC, SiN, SiON, and doped versions thereof, may be suitably deposited by including a silicon source and a source of the desired element(s) in the feed gas, in amounts effective to produce a film having the desired stoichiometry, as determined by routine experimentation. Amounts may be controlled by controlling the partial pressures of each of the gaseous components in the feed gas and/or deposition chamber, as determined by routine experimentation. The composition of the feed gas may be varied within a stage and/or from stage to stage in the process, in a continuous or stepwise manner.

For the deposition of doped polysilicon as well as Si-containing alloys and doped versions thereof, the feed gas preferably comprises a silicon source and one or more precursors selected from the group consisting of germanium source, carbon source, boron source, gallium source, indium source, arsenic source, phosphorous source, antimony source, nitrogen source and oxygen source. Specific examples of such sources include: silane, disilane, trisilane, tetrasilane, and mixtures thereof as silicon sources; germane, digermane and trigermane as germanium sources; $NF_3$, ammonia, hydrazine, atomic nitrogen, and mixtures thereof as nitrogen sources; various hydrocarbons and mixtures thereof, e.g., methane, ethane, propane, etc. as carbon sources; monosilylmethane, disilylmethane, trisilylmethane, tetrasilylmethane and mixtures thereof as sources of both carbon and silicon; $N_2O$ and NO as sources of both nitrogen and oxygen; and various dopant precursors as sources of dopants such as antimony, arsenic, boron, gallium, indium and phosphorous.

The total pressure in the CVD chamber is suitably in the range of about 0.001 Torr to about 800 Torr, preferably in the range of about 0.1 Torr to about 200 Torr, more preferably in the range of about 1 Torr to about 80 Torr. Surprisingly, the processes described herein obtain extremely high uniformity when conducted above conventional low pressure CVD (LPCVD) pressure ranges (typically in the milliTorr range). The partial pressure of the silicon source or mixture thereof is preferably in the range of about $1 \times 10^{-6}\%$ to about 100% of the total pressure, more preferably about $1 \times 10^{-4}\%$ to about 100%, same basis. The partial pressure of each of the other precursors, if any, is typically in the range of from 0% to about 50% of the total pressure, depending on the type of precursor and the amount of the particular element in the precursor to be incorporated into the resulting film.

Incorporation of dopants into Si-containing films by CVD using a silicon source is preferably accomplished by in situ doping using gas phase dopant precursors. Precursors for electrically active dopants include diborane, deuterated diborane, phosphine, arsenic vapor, and arsine. Silylphosphines, e.g., $(H_3Si)_{3-x}PR_x$, and silylarsines, e.g., $(H_3Si)_{3-x}AsR_x$, where $x=0-2$ and $R_x=H$ and/or D, are preferred precursors for phosphorous and arsenic as dopants. $SbH_3$, $SbD_3$, and trimethylindium are preferred sources of antimony and indium, respectively. Such dopant precursors are useful for the preparation of preferred films as described above, preferably boron-, phosphorous-, antimony-, indium-, and arsenic-doped silicon, SiC, SiGe and SiGeC films and alloys. Typical concentrations of dopant precursors in the feed gas can be in the range of about 1 part per million (ppm) to about 1% by weight based on total feed gas weight, although higher or lower amounts are sometimes preferred in order to achieve the desired property in the resulting film. In the preferred Epsilon™ series of single wafer reactors, dilute mixtures of dopant precursor in a carrier gas can be delivered to the reactor via a mass flow controller with set points ranging from about 10 to about 200 sccm, depending on desired dopant concentration and dopant gas concentration. The dilute mixture is preferably further diluted by mixing with silicon source (e.g., trisilane) and any silicon source carrier gas. Since typical total flow rates for deposition in the preferred Epsilon™ series reactors often range from about 20 standard liters per minute (slm) to about 180 slm, the concentration of the dopant precursor used in such a method is usually very small.

EXAMPLES 1–8

Figure 7:
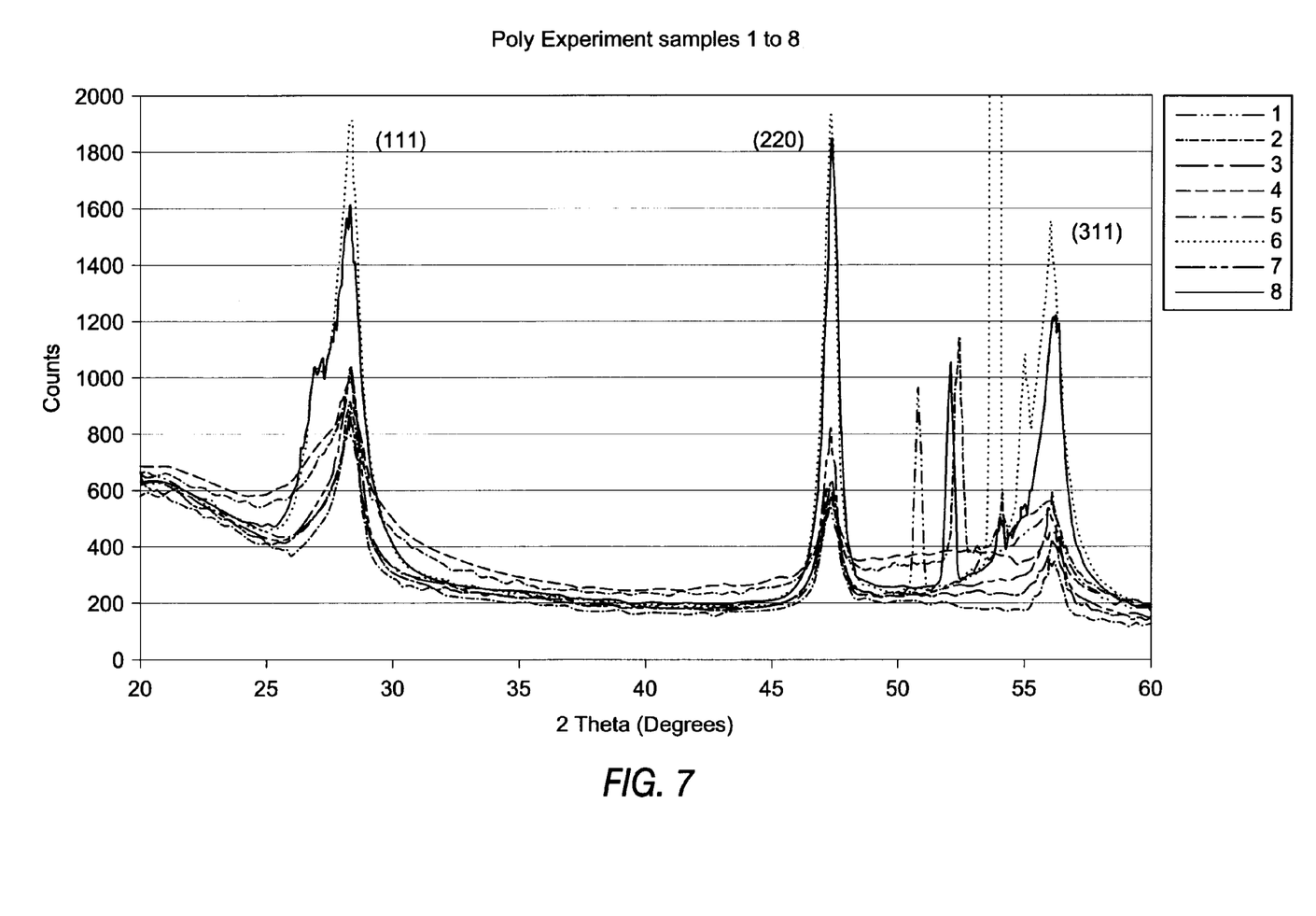
FIG. 7 shows XRD spectra of polysilicon films obtained by the practice of preferred embodiments.

A series of films was deposited under the deposition conditions shown in Table 1, as follows: A $SiO_2$ substrate was placed into an Epsilon™ E-2500 reactor and heated to a temperature of about 750° C. under flowing hydrogen (20 slm) and at a pressure of about 20 Torr. A first layer of polysilicon (about 100 Å) was deposited onto the substrate by introducing a feed gas containing hydrogen and trisilane to the reactor at a first flow rate of about 20 sccm (bubbler at 22° C., trisilane flow rate about 0.03 grams per minute) or about 92 sccm (bubbler at 22° C., trisilane flow rate about 0.14 grams per minute), as shown in Table 1, for about 15 seconds. The feed gas was then turned off and the first polysilicon layer was annealed for about 60 seconds as the substrate was allowed to cool from 750° C. to about 630° C. or 680° C. (as shown in Table 1) at 20 Torr to alter the morphology of the first polysilicon layer. The feed gas was then turned on and a second polysilicon layer was deposited onto the annealed polysilicon layer at a second flow rate of 20 sccm (bubbler at 22° C. 20 slm hydrogen) or 92 sccm (bubbler at 22° C., 20 slm hydrogen) at 630° C. or 680° C. and 20 Torr for the deposition time shown in Table 1. The resulting polysilicon films (comprising the annealed first polysilicon layer and the second polysilicon layer) had the thickness values shown in Table 1. The microstructure of these polysilicon films were then determined by XRD as shown in FIG. 7. The sharp peaks in the XRD spectrum shown in FIG. 7 show that the polysilicon films, deposited at 630° C. or 680° C., had a highly polycrystalline microstructure.

TABLE 1

| No. | First flow rate, sccm | Temp., ° C. | Second flow rate, sccm | Deposition Time, min. | Thickness, Å |
|---|---|---|---|---|---|
| 1 | 20 | 630 | 20 | 3 | 432 |
| 2 | 20 | 630 | 92 | 2 | 1208 |
| 3 | 92 | 630 | 20 | 3 | 546 |
| 4 | 92 | 630 | 92 | 2 | 1261 |
| 5 | 20 | 680 | 20 | 3 | 477 |
| 6 | 20 | 680 | 92 | 2 | 1387 |
| 7 | 92 | 680 | 20 | 3 | 610 |
| 8 | 92 | 680 | 92 | 2 | 1519 |

EXAMPLES 9–12 (COMPARATIVE)

Figure 8:
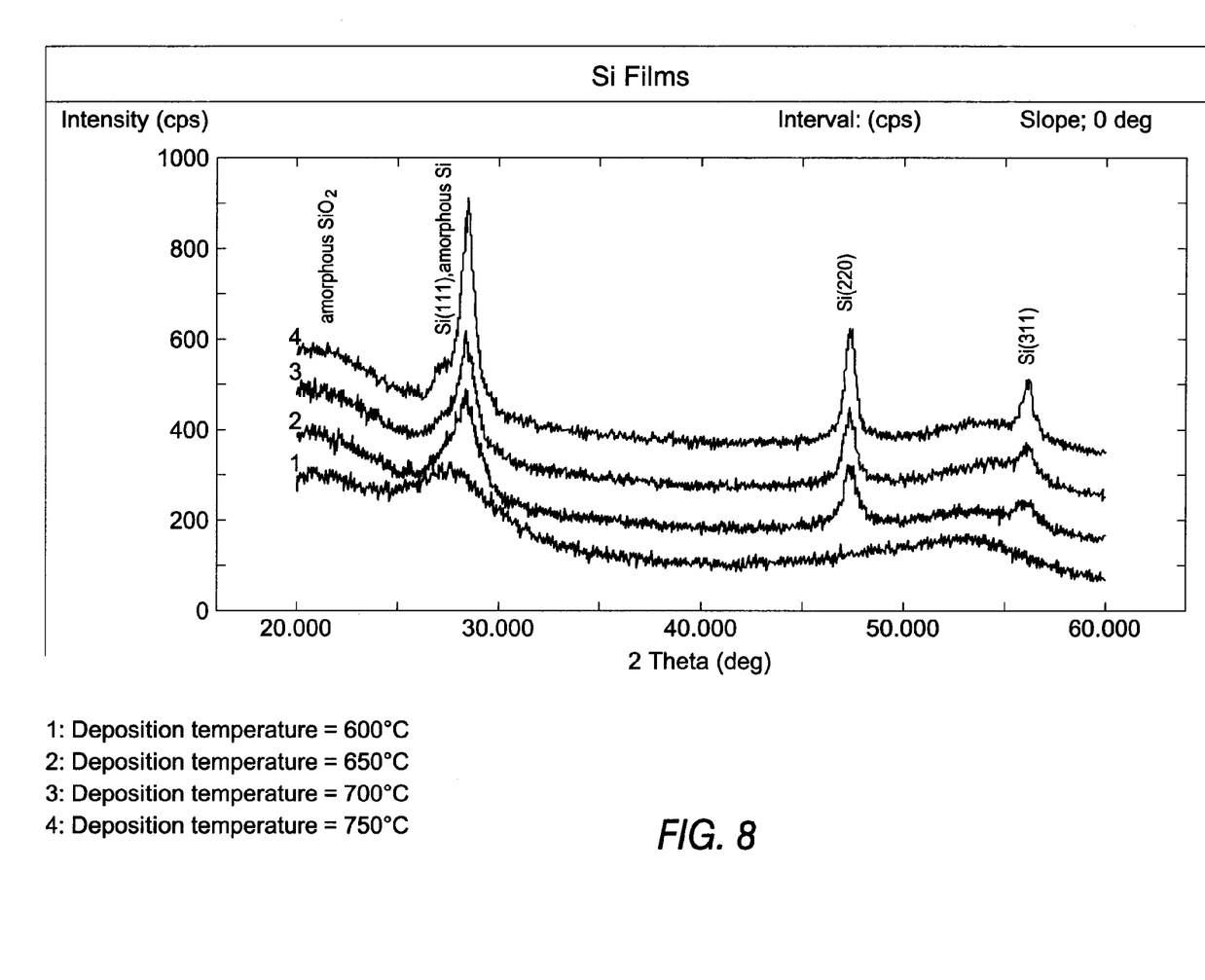
FIG. 8 shows the XRD spectra obtained for a series of control films deposited at various temperatures.

A series of polysilicon films were deposited using the same feed gas as in Examples 1–8 under fixed deposition conditions (40 Torr pressure, 92 sccm feed gas flow rate), except that the deposition temperature was varied from film to film over the range 600° C. to 750° C. in 50° C. increments. The microstructures of the resulting films were then determined by XRD as shown in FIG. 8. The results show that the films deposited at 600° C. and 650° C. (bracketing the 630° C. deposition temperature used in Examples 1–4) were much less polycrystalline than the films obtained in Examples 1–8. Films having microstructures approaching the highly polycrystalline microstructure obtained at 630° C. and 680° C. in Examples 1–8 were only obtained at much higher deposition temperatures (700° C. and 750° C.).

EXAMPLE 13

A HfO$_2$ substrate is placed into an Epsilon™ E-2500 reactor and heated to a temperature of about 575° C. under flowing nitrogen (10 slm) and at a pressure of about 10 Torr. A first layer of amorphous silicon (about 20 Å) is deposited onto the substrate by introducing a feed gas containing hydrogen and trisilane to the reactor at a flow rate of 10 sccm (bubbler) for about 30 seconds. The feed gas is then turned off and the amorphous first silicon layer is annealed for about 240 seconds at 575° C. and 10 Torr to alter the morphology of the as-deposited layer, thereby forming an annealed polysilicon layer. The feed gas is then turned on and a second polysilicon layer is deposited onto the annealed polysilicon layer using the same feed gas but at a flow rate of 90 sccm (bubbler) at 575° C. and 20 Torr for about two minutes. The microstructure of the resulting polysilicon film (comprising the annealed polysilicon layer and the second polysilicon layer) is then determined by XRD and found to have a greater degree of crystallization than that of a control film deposited under the same conditions except in a continuous manner, without annealing.

EXAMPLE 14 (COMPARATIVE)

A SiGe-containing film was deposited onto a SiO$_2$ substrate (without a nucleation layer) at a temperature of 600° C. using silane and germane as precursors. The silane flow rate was 20 sccm. The germane was provided as a 1.5% mixture in hydrogen at 65 sccm. Hydrogen carrier gas was used at a flow rate of 20 slm, the deposition pressure was 80 Torr, and the deposition was carried out for about 20 minutes. The surface roughness of the resulting SiGe film (as measured by atomic force microscopy) was 226 Å rms for a 10 micron×10 micron scan area. Scanning electron microscopy (SEM) of the SiGe film revealed pyramidal, faceted grains indicative of an island-type deposition, as demonstrated in the SEM photomicrograph shown in FIG. 3.

EXAMPLE 15

A SiGe-containing film was deposited at 600° C. as described in Example 14, except that trisilane was used in place of silane. The deposition pressure was 40 Torr, the hydrogen carrier flow rate was 20 slm and the germane was provided to the reactor as a 10% mixture in hydrogen. Trisilane was provided in the form of a feed gas containing hydrogen and trisilane at a flow rate of about 77 sccm (bubbler at 22° C., trisilane flow rate about 0.12 grams per minute) and the deposition was carried out for about two minutes. The surface roughness of the resulting SiGe film (as measured by atomic force microscopy) was 18.4 Å rms for a 10 micron×10 micron scan area. SEM of the SiGe film revealed a much more uniform surface, as demonstrated in the SEM photomicrograph shown in FIG. 4 (same magnification as FIG. 3).

EXAMPLE 16

A Si$_3$N$_4$ substrate is placed into an Epsilon™ E-2500 reactor and heated to a temperature of about 650° C. under flowing nitrogen (20 slm) and at a pressure of about 20 Torr. A first polyilicon templating layer (about 30 Å) is deposited onto the substrate under first deposition conditions by introducing a feed gas containing hydrogen and trisilane to the reactor at a flow rate of 10 sccm (bubbler at 22° C., trisilane flow rate about 0.015 grams per minute) for about 15 seconds. A second polysilicon layer is then deposited onto the first polysilicon layer under second deposition conditions by ramping the feed gas flow rate up to about 100 sccm over the course of 30 seconds and then maintaining that flow rate for an additional 60 seconds to deposit a film having a total thickness (sum of first layer and second layer) of about 900 Å. The microstructure of the resulting polysilicon film (comprising the first polysilicon layer and the second polysilicon layer) is then examined by XRD. The size, number and intensity of peaks in the XRD spectrum is different from that of a comparable film (see Example 17 below) deposited onto a $Si_3N_4$ substrate using the second deposition conditions (except deposition time) without the first Si-containing templating layer, and thus the polycrystalline morphology of this film is different from that of the comparable film.

EXAMPLE 17 (COMPARATIVE)

A comparable film is deposited onto a $Si_3N_4$ substrate using the deposition conditions described in Example 16 for the deposition of the second polysilicon layer, except that the deposition time is increased to produce a film thickness of about 900 Å (about equal to film thickness in Example 16). The microstructure of this comparable film is then determined by XRD. The size, number and intensity of peaks in the XRD spectrum is different from that of the film described in Example 16 above.

EXAMPLE 18

A $SiO_2$ substrate is placed into an Epsilon™ E-2500 reactor and heated to a temperature of about 650° C. under flowing hydrogen (10 standard liters per minute) and at a pressure of about 20 Torr. A first layer of polysilicon (about 75 Å) is deposited onto the substrate by introducing a first feed gas containing hydrogen and trisilane to the reactor at an initial flow rate of 10 sccm (bubbler at 22° C., trisilane flow rate about 0.015 grams per minute) that is ramped up to 50 sccm over 20 seconds. The feed gas is then turned off and the polysilicon layer is annealed for about 20 seconds at 650° C. and 20 Torr to alter the morphology and crystalline structure of the polysilicon layer. A second feed gas containing hydrogen (20 slm) and silane (200 sccm) is then introduced to the reactor for about 1 minute to deposit a second polysilicon layer onto the first layer. The microstructure and morphology of the resulting polysilicon film (comprising the annealed polysilicon layer and the second polysilicon layer) are then measured by XRD and AFM. The resulting polysilicon film is found to have a greater degree of crystallization than that of a control film deposited under the same conditions except without annealing the first layer.

EXAMPLE 19

A $SiO_2$ substrate is placed into an Epsilon™ E-2500 reactor and heated to a temperature of about 650° C. under flowing hydrogen (10 standard liters per minute) and at a pressure of about 20 Torr. A thin layer of polysilicon (about 50 Å) is deposited onto the substrate by introducing a first feed gas containing hydrogen and trisilane to the reactor at an flow rate of 25 sccm (bubbler at 22° C., trisilane flow rate about 0.03 grams per minute). The feed gas is then turned off and the polysilicon layer is annealed for about 30 seconds at 650° C. and 20 Torr to alter the morphology and crystalline structure of the polysilicon layer. A second feed gas containing hydrogen (20 slm) and trisilane is then introduced to the reactor at a flow rate of 45 sccm (bubbler at 22° C., trisilane flow rate about 0.06 grams per minute) for about 2 minutes to deposit a second polysilicon layer onto the first layer. The microstructure and morphology of the resulting polysilicon film (comprising the annealed polysilicon layer and the second polysilicon layer) are then measured using XRD. The size, number and intensity of peaks in the XRD spectrum are different from that of a comparable film deposited under the same conditions except without annealing the first layer.

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. A method for depositing a polycrystalline Si-containing film, comprising:
   depositing a first Si-containing layer onto a substrate, the first Si-containing layer having a first morphology;
   annealing the first Si-containing layer for a period of time that is effective to alter the first morphology, thereby forming an annealed first Si-containing layer; and
   depositing a second Si-containing layer onto the annealed first Si-containing layer the second Si-containing layer having a polycrystalline morphology different from the first morphology.

2. The method of claim 1 in which the first Si-containing layer is deposited at a temperature in the range of about 600° C. to about 700° C.

3. The method of claim 2 in which the annealing of the first Si-containing layer is conducted at a temperature in the range of about 600° C. to about 700° C.

4. The method of claim 1 in which the first Si-containing layer is deposited at a pressure in the range of about 1 Torr to about 800 Torr.

5. The method of claim 1 in which the first Si-containing layer has a thickness that is less than the thickness of the second Si-containing layer.

6. The method of claim 5 in which the thickness of the first Si-containing layer is about 200 Å or less.

7. The method of claim 1 in which the depositing of the first Si-containing layer is conducted using a feed gas comprising trisilane.

8. The method of claim 7 in which the depositing of the second Si-containing layer is conducted using a feed gas comprising trisilane.

9. The method of claim 7 in which the depositing of the first Si-containing layer is conducted in a horizontal flow, single wafer reactor.

10. The method of claim 1 in which the depositing of the first Si-containing layer is conducted using a first feed gas and the depositing of the second Si-containing layer is conducted using a second feed gas, the first feed gas being different from the second feed gas.

11. The method of claim 10 in which the first feed gas comprises a first silicon source and the second feed gas comprises a second silicon source, the first silicon source being different from the second silicon source.

12. The method of claim 1 in which the period of time of the annealing is in the range of about 5 seconds to about one minute.

13. The method of claim 1 in which the first morphology is a polycrystalline morphology.

14. The method of claim 1 in which the second Si-containing layer is selected from the group consisting of polysilicon, SiGe, SiGeC, SiN, and SiON.

15. The method of claim 14 in which the second Si-containing layer comprises an electrically active dopant.

16. The method of claim 14 in which the substrate comprises a material selected from the group consisting of polysilicon, $SiO_2$, and single crystal silicon.

17. The method of claim 1 in which the first Si-containing layer comprises amorphous silicon.

18. The method of claim 17 in which the depositing of the first Si-containing layer is conducted using a feed gas comprising trisilane.

19. The method of claim 17 in which the annealed first Si-containing layer and the second Si-containing layer both comprise the same material.

20. The method of claim 17 which the annealed first Si-containing layer comprises polysilicon.

21. The method of claim 20 in which the annealed first Si-containing layer has a thickness of about 500 Å or less.

22. The method of claim 20 in which the second Si-containing layer comprises polysilicon.

23. The method of claim 22 in which the annealed first Si-containing layer is a morphological template for the second Si-containing layer.

24. A method for depositing a polycrystalline Si-containing film, comprising:

depositing a first polycrystalline Si-containing templating layer onto a substrate under first deposition conditions effective to provide the first polycrystalline Si-containing templating layer with a first degree of crystallization that is greater than 80%, and depositing a second polycrystalline Si-containing layer onto the first polycrystalline Si-containing templating layer under second deposition conditions different from the first deposition conditions, the second polycrystalline Si-containing layer having a second degree of crystallization that is at least equal to the first degree of crystallization, the first polycrystalline Si-containing templating layer and the second polycrystalline Si-containing layer together forming a Si-containing film, the Si-containing film having a polycrystalline morphology different from that of a comparable film deposited onto the substrate using the second deposition conditions without the first polycrystalline Si-containing templating layer.

25. The method of claim 24 in which the first deposition rate is in the range of about one Å per minute to about 2,000 Å per minute.

26. The method of claim 25 in which the second deposition rate is at least about 10% greater than the first deposition rate.

27. The method of claim 24 in which the first deposition conditions comprising providing a first feed gas at a first feed gas flow rate in the range of about 1 sccm to about 1,000 sccm.

28. The method of claim 27 in which second deposition conditions comprising providing a second feed gas at a second feed gas flow rate that is greater than the first feed gas flow rate.

29. The method of claim 28 comprising a stepwise change from the first feed gas flow rate to the second feed gas flow rate.

30. The method of claim 28 comprising a continuous change from the first feed gas flow rate to the second feed gas flow rate.

31. The method of claim 28 in which the first feed gas and the second feed gas are the same.

32. The method of claim 28 in which the first feed gas is different from the second feed gas.

33. The method of claim 32 in which the first feed gas comprises a first silicon source and the second feed gas comprises a second silicon source, the first silicon source being different from the second silicon source.

34. The method of claim 33 in which the first feed gas comprises trisilane and the second feed gas comprises silane.

35. The method of claim 28 in which the first feed gas comprises trisilane.

36. The method of claim 35 in which the second feed gas comprises trisilane.

37. The method of claim 35 in which the depositing of the first Si-containing layer is conducted in a horizontal flow, single wafer reactor.

38. The method of claim 37 in which the first feed gas flow rate is in the range of about 1 sccm to about 500 sccm.

39. The method of claim 24 in which the second polycrystalline Si-containing layer is selected from the group consisting of polysilicon, SiGe, SiGeC, SiN, and SiON.

40. The method of claim 39 in which the second polycrystalline Si-containing layer comprises an electrically active dopant.

41. The method of claim 24, further comprising annealing the first polycrystalline Si-containing templating layer.

* * * * *

UNITED STATES PATENT AND TRADEMARK OFFICE
CERTIFICATE OF CORRECTION

PATENT NO. : 7,005,160 B2
APPLICATION NO. : 10/424207
DATED : February 28, 2006
INVENTOR(S) : Michael A. Todd and Keith D. Weeks It is certified that error appears in the above-identified patent and that said Letters Patent is hereby corrected as shown below:

On the Title Page:

Column 2, under Other Publications, Line 3, Delete "vol." and insert --Vol.--, therefor.

In Column 11, Line 19, Delete "$RuSiO_x,N_Y,$" and insert --$RuSiO_xN_y,$--, therefor.

In Column 13, Line 17, Delete "C. 20" and insert --C., 20--, therefor.

In Column 14, Line 52, Delete "polyilicon" and insert --polysilicon--, therefor.

In Column 16, Line 12, Claim 1, delete "layer" and insert --layer,--, therefor.

In Column 17, Line 1, Claim 20, after "17" insert --in--.

In Column 17, Line 16, Claim 24, delete "80%," and insert --80%;--, therefor.

Signed and Sealed this

Eleventh Day of March, 2008

JON W. DUDAS
*Director of the United States Patent and Trademark Office*